US007692179B2

(12) United States Patent
Islam et al.

(10) Patent No.: US 7,692,179 B2
(45) Date of Patent: Apr. 6, 2010

(54) NANOWIRE DEVICE WITH (111) VERTICAL SIDEWALLS AND METHOD OF FABRICATION

(75) Inventors: M. Saif Islam, Mountain View, CA (US); Yong Chen, Sherman Oaks, CA (US); Shih-Yuan Wang, Palo Alto, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 366 days.

(21) Appl. No.: 10/888,628

(22) Filed: Jul. 9, 2004

(65) Prior Publication Data

US 2006/0006463 A1    Jan. 12, 2006

(51) Int. Cl.
    *H01L 29/06* (2006.01)
(52) U.S. Cl. .................. 257/14; 257/9; 257/79; 257/99; 257/347
(58) Field of Classification Search .............. 257/9, 257/14, 79, 99, 347
    See application file for complete search history.

(56) References Cited

U.S. PATENT DOCUMENTS

| 5,883,012 | A | | 3/1999 | Chiou et al. |
| 5,980,762 | A | | 11/1999 | Otani et al. |
| 6,090,635 | A | * | 7/2000 | Rothman et al. ............ 438/24 |
| 6,103,540 | A | * | 8/2000 | Russell et al. ............. 438/22 |
| 6,459,095 | B1 | | 10/2002 | Heath et al. |
| 2003/0054646 | A1 | | 3/2003 | Yotsuya |
| 2004/0136866 | A1 | * | 7/2004 | Pontis et al. ............... 422/57 |
| 2005/0142766 | A1 | * | 6/2005 | Hareland et al. ........... 438/268 |
| 2005/0164435 | A1 | * | 7/2005 | Park et al. ................. 438/162 |
| 2005/0212531 | A1 | * | 9/2005 | Wei ........................... 324/664 |
| 2006/0211183 | A1 | * | 9/2006 | Duan et al. ................ 438/149 |

FOREIGN PATENT DOCUMENTS

EP    1434321    6/2004

OTHER PUBLICATIONS

Z. Li et al., "Sequence-Specific Label-Free DNA Sensors Based on Silicon Nanowires", Nano Letters, vol. 4, No. 2, (2004) pp. 245-247.
K. Early, M. L. Schattenburg and Henry L. Smith, "Absence of Resolution Degradation in X-ray Lithography for [Wavelength] from 4.5 nm to 0.83 nm", Microelectronic Engineering, 11 (1990) 317-321.

(Continued)

*Primary Examiner*—Long Pham (57) ABSTRACT

A nano-scale device and method of fabrication provide a nanowire having (111) vertical sidewalls. The nano-scale device includes a semiconductor-on-insulator substrate polished in a [110] direction, the nanowire, and an electrical contact at opposite ends of the nanowire. The method includes wet etching a semiconductor layer of the semiconductor-on-insulator substrate to form the nanowire extending between a pair of islands in the semiconductor layer. The method further includes depositing an electrically conductive material on the pair of islands to form the electrical contacts. A nano-pn diode includes the nanowire as a first nano-electrode, a pn-junction vertically stacked on the nanowire, and a second nano-electrode on a (110) horizontal planar end of the pn-junction. The nano-pn diode may be fabricated in an array of the diodes on the semiconductor-on-insulator substrate.

14 Claims, 5 Drawing Sheets

OTHER PUBLICATIONS

Yong Chen et al., "Nanoscale Molecular-Switch Devices Fabricated by Imprint Lithography", Applied Phys. Lett., vol. 82, No. 10 (Mar. 10, 2003) pp. 1610-1612.

T. Shimada, K. Hiruma, M. Shirai, M. Yazawa, K. Haraguchi. T. Sato, M. Matsui, and T. Katsuyama, "Size, position and direction control on GaAs and InAs nanowhisker growth," Superlattices and Microstructures, vol. 24, pp. 453-458 (1998).

K. Haraguchi, K. Hiruma, K. Hosomi, M. Shirai, and T. Katsuyama, "Growth mechanism of planar-type GaAs nanowhiskers," J. Vac. Sci. Technol. B, vol. 15, pp. 1685-1687 (Sep./Oct. 1997).

K. Haraguchi, K. Hiruma, T. Katsuyama, K. Tominaga, M. Shirai, and T. Shimada, "Self-organized fabrication of planar GaAs nanowhisker arrays," Appl. Phys. Lett., vol. 69, pp. 386-387 (Jul. 15, 1996).

Yi Cui and Charles M. Lieber, "Functional Nanoscale Electronic Devices Assembled Using Silicon Nanowire Building Blocks", Science, vol. 291, Feb. 2, 2001, pp. 851-853.

"Making nanowire lattices in a snap", Materialstoday, vol. 6, Issue 5, May 2003, p. 6.

* cited by examiner

NANOWIRE DEVICE WITH (111) VERTICAL SIDEWALLS AND METHOD OF FABRICATION

BACKGROUND

1. Technical Field

The invention relates to nanotechnology and the fabrication of nano-scale structures. In particular, the invention relates to fabrication of a nanowire and a device having a nanowire using wet chemical etching.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having dimensions that are often 50 to 100 times smaller than conventional semiconductor structures. Typically, either e-beam patterning or nano-imprinting combined with dry etching, such as reactive ion etching (RIE), are techniques used to fabricate nano-scale structures.

However, e-beam lithography is slow and therefore of limited use in high throughput or production situations. Moreover, e-beam lithography has limited resolution in the nano-scale range. While nano-imprinting is viable, the RIE process used therewith causes crystal degradation, introduces surface roughness in the sidewalls of the patterns, and uses a metal mask that contaminates the nano-structures with metal ions. Moreover, the conventional RIE process tends to impose limitations on the dimensions of the fabricated nano-structures. For example, the mask used in RIE etching mimics or even exacerbates the sidewall roughness of the nano-patterns because the mask remains rough at the micro-scale even with extreme precision writing.

Whether used with e-beam patterning or nano-imprinting, the surface roughness imparted on sidewalls of fabricated nano-structures by the RIE process is unacceptable at such nano-scale dimensions. For example, such surface roughness impacts nano-structure performance and reliability and limits nano-structure design, such as spacing or pitch between nanowires, for example. Moreover, the fabrication of nano-structures using e-beam patterning or nano-imprinting with RIE is time consuming. As such, production quantities of nano-structures fabricated conventionally can be costly.

Accordingly, it would be desirable to fabricate nano-structures with higher reliability and performance and higher nano-scale resolution with less surface roughness (i.e., smoother surfaces) at potentially lower cost and higher throughput. Such a fabricated nano-structure would solve a long-standing need in the area of nanotechnology.

BRIEF SUMMARY

In some embodiments of the present invention, a nano-scale device is provided. The nano-scale device comprises a semiconductor-on-insulator substrate polished in a [110] direction. The nano-scale device further comprises a semiconductor nanowire having vertical sidewalls that are (111) vertical planes. The (111) vertical sidewalls extend from a (110) horizontal surface to an insulator layer of the [110]-polished substrate. The nano-scale device further comprises an electrical contact at opposite ends of the nanowire.

In other embodiments of the present invention, a nano-pn diode is provided. The nano-pn diode comprises a first nano-electrode having parallel vertical sidewalls that are (111) vertical planes of a semiconductor-on-insulator wafer polished in a [110] direction. The nano-pn diode further comprises a nano-pn junction vertically stacked on the first nano-electrode, such that the nano-pn junction has a pair of vertical sidewalls that share the (111) planes of the first nano-electrode. The nano-pn junction further has a (110) horizontal planar end. The nano-pn diode further comprises a second nano-electrode deposited on the (110) horizontal planar end of the nano-pn junction.

In still other embodiments of the present invention, methods of fabricating the nano-scale device and the nano-pn diode are provided. In each of the methods, a semiconductor-on-insulator substrate polished in a [110] direction is wet etched to form a semiconductor nanowire with vertical sidewalls that are (111) vertical planes.

Certain embodiments of the present invention have other features in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
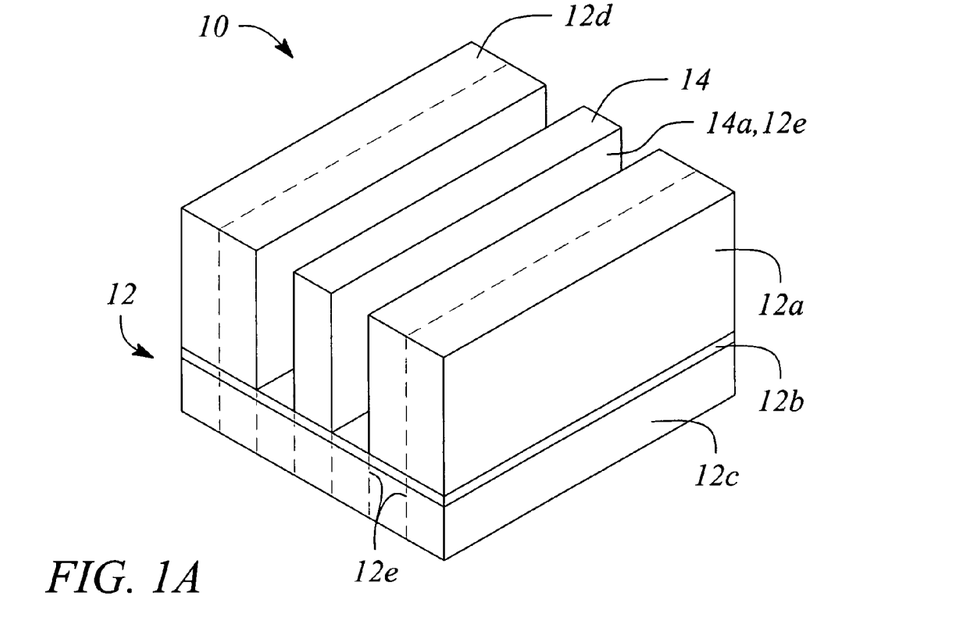
FIG. 1A illustrates a perspective view of an embodiment of a nano-scale structure according to an embodiment of the present invention.
Figure 1B:
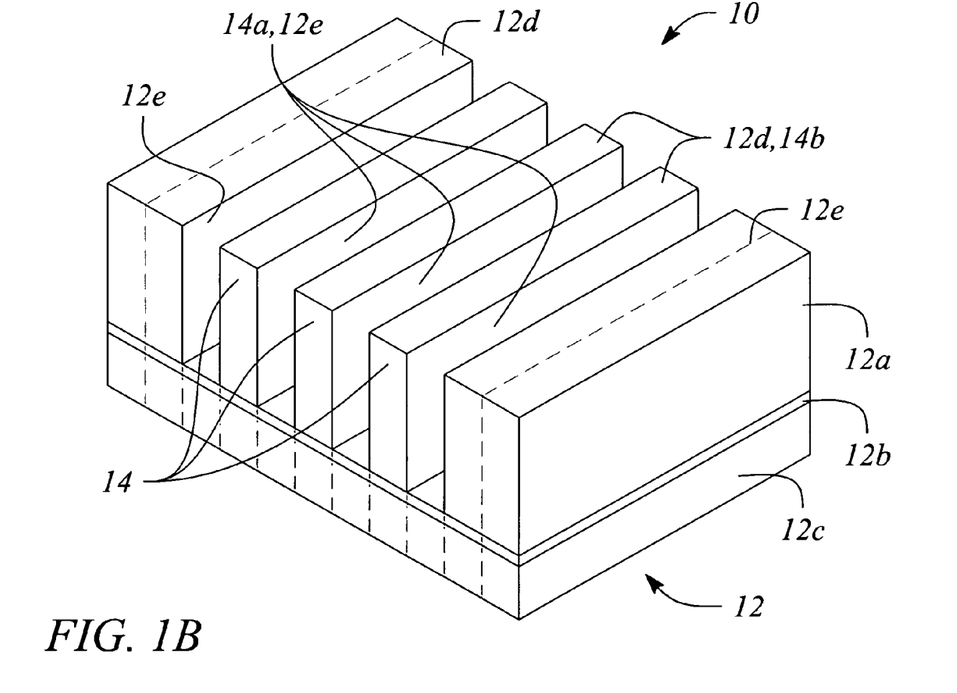
FIG. 1B illustrates a perspective view of another embodiment of a nano-scale structure according to an embodiment of the present invention.
Figure 1C:
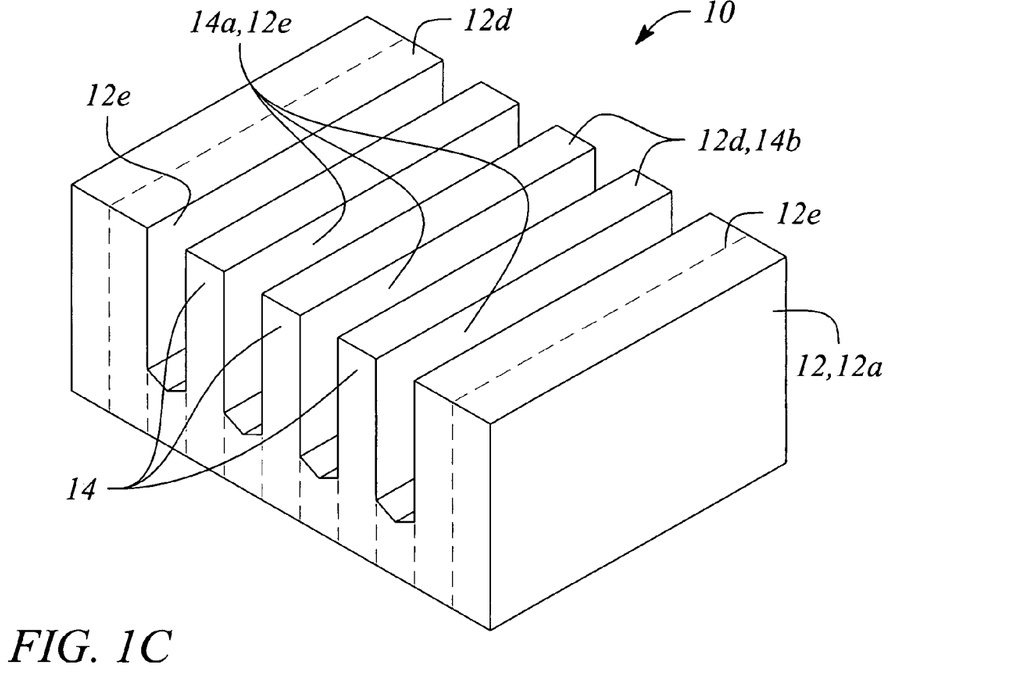
FIG. 1C illustrates a perspective view of another embodiment of a nano-scale structure according to an embodiment of the present invention.

FIGS. 1A-1C illustrate a perspective view of embodiments of a nano-scale structure 10 in accordance with an embodiment of the present invention. The nano-scale structure 10 comprises a semiconductor substrate 12 that is polished in a [110] direction, and a semiconductor nanowire 14 wet chemically etched in the semiconductor layer 12a.

The semiconductor substrate 12 is either a semiconductor wafer 12, 12a or a semiconductor-on-insulator wafer 12. The semiconductor-on-insulator wafer 12 comprises a semiconductor layer 12a adjacent to an insulator layer 12b and a remainder support material 12c of the wafer 12 adjacent to the insulator layer 12b, as illustrated in FIGS. 1A and 1B. The semiconductor wafer 12, 12a is illustrated in FIG. 1C. Therefore, the term 'semiconductor layer' is used herein to mean either a semiconductor wafer 12, 12a or a semiconductor-on-insulator wafer 12 having a semiconductor layer 12a, unless otherwise specified.

By [110] direction, it is meant that a major horizontal planar surface 12d of the semiconductor substrate 12 (i.e., wafer 12, 12a or of the semiconductor layer 12a) is a (110) horizontal lattice plane. The use of brackets '[ ]' and parenthesis '( )' herein pertains to a direction and a plane of a crystal lattice, respectively, when used herein to enclose such numbers as 110 and 111, and is intended to follow standard crystallographic nomenclature known in the art. Moreover, the semiconductor substrate 12 has a plurality of (111) vertical lattice planes 12e that intersect with the major horizontal surface 12d that are illustrated in FIGS. 1A-1C by dashed-lines. For the purposes of discussion herein, and not by way of limitation, the (110) horizontal lattice plane of the crystal structure is considered to be horizontally oriented with respect to a Cartesian coordinate system. The (110) horizontal surface is a (110) horizontal plane. The (111) vertical lattice planes are approximately perpendicular to and intersect with the (110) horizontal surface of the wafer. Therefore for the purposes of discussion herein, the (111) vertical planes are considered to be approximately vertically oriented relative to the (110) horizontal surface or plane of the wafer.

Referring back to FIGS. 1A and 1B, the nanowire 14 extends vertically from the (110) horizontal surface 12d of the semiconductor layer 12a to a depth in the semiconductor layer 12a dictated by the wet chemical etching and/or dictated by a location of the insulator layer 12b. The nanowire 14 has a vertical sidewall 14a. The sidewall 14a is, and is aligned with, a (111) vertical lattice plane 12e of the semiconductor layer 12a. Effectively, the nanowire 14 has a pair of sidewalls, each being a (111) vertical plane. The sidewalls 14a have a characteristically smooth planar surface, which is essentially atomically planar, due to the use of wet chemical etching to form the nanowire 14 rather than conventional dry etching techniques, such as reactive ion etching (RIE). In some embodiments, the semiconductor layer 12a and in particular, the nanowire 14, have characteristically reduced crystal structure damage relative to when dry etching techniques (e.g., RIE) are used to form a nanowire. Moreover in some embodiments, the nanowire 14 has fewer metal ion contaminants relative to when dry etching and a metal etch mask are used to form a nanowire, as further described below.

Wet chemical etching solutions that favor anisotropically etching in the vertical direction much more than the horizontal direction are particularly useful in achieving the nano-scale device 10 of the present invention. In particular, wet chemical etching solutions that etch (110) horizontal lattice planes in the semiconductor much faster than (111) vertical lattice planes, thereby maintaining a crystal lattice smoothness of the (111) vertical lattice plane, are particularly useful for the embodiments of the present invention. See for example, *High-Speed Semiconductor Devices*, Edited by S. M. Sze, A Wiley-Interscience Publication, John Wiley & Sons, Inc., 1990, at least Part I, Section 1.4, pp 33-51. An anisotropically wet-chemical etched nanowire 14 typically has a sidewall height or depth that is taller than a width or thickness of the nanowire 14. Moreover, the nanowire 14 has a length that is typically much longer than the height or the width of the nanowire 14. The nanowire 14 length facilitates more surface area of the nanowire 14. These relative dimensions are not intended as limitations to the various embodiments of the invention described herein. Wet etching the semiconductor layer 12a is described in more detail below with respect to a method of fabricating a nano-scale structure.

In some embodiments, the nano-scale structure 10 comprises a plurality of spaced apart nanowires 14 wet chemically etched in the semiconductor layer 12a. FIGS. 1B and 1C illustrate perspective views of the other embodiments of the nano-scale structure 10 having a plurality of nano-scale spaced nanowires 14. FIG. 1B illustrates a plurality of nanowires 14 in a semiconductor-on-insulator wafer 12. FIG. 1C illustrates a plurality of nanowires 14 in a semiconductor wafer 12, 12a. In these embodiments, the nanowires 14 are parallel to each other and have a spacing between nanowires 14 that is within the nano-scale range. The wet chemically etched nanowire sidewalls 14a are quite smooth relative to nanowires that are dry chemically etched, such that they can be nano-scale closely spaced (e.g., an atomic or crystal spacing of one or more adjacent (111) vertical lattice planes) if desired, without jeopardizing their electrical isolation from adjacent nanowires 14. For example, in some embodiments, a width of the nanowire may range from a few tenths of a micron, and the spacing between the nanowires 14 may range from about 5 nm to about 100 μm.

In some embodiments, the nano-scale structure 10 further comprises means for measuring or monitoring a response of the nanowire to a stimulus. For example, the nanowire 14 is made of the semiconductor material of the layer 12a. The semiconductor nanowire 14 is characteristically responsive to a stimulus. In some embodiments, the nanowire 14 will exhibit a change in one or both of an electrical characteristic, such as conductivity or resistivity, and a physical characteristic, such as vibration or movement, of the semiconductor material when the nanowire 14 is exposed to a stimulus that affects such a characteristic. The characteristic change or response mechanism of the nanowire 14 can be measured using the measuring or monitoring means. Therefore in some embodiments, the nano-scale structure 10 may be a nano-scale device, such as a sensor that senses changes in an environment adjacent to the device, or a diode that carries current in response to an external power source, for example.

Figure 2:
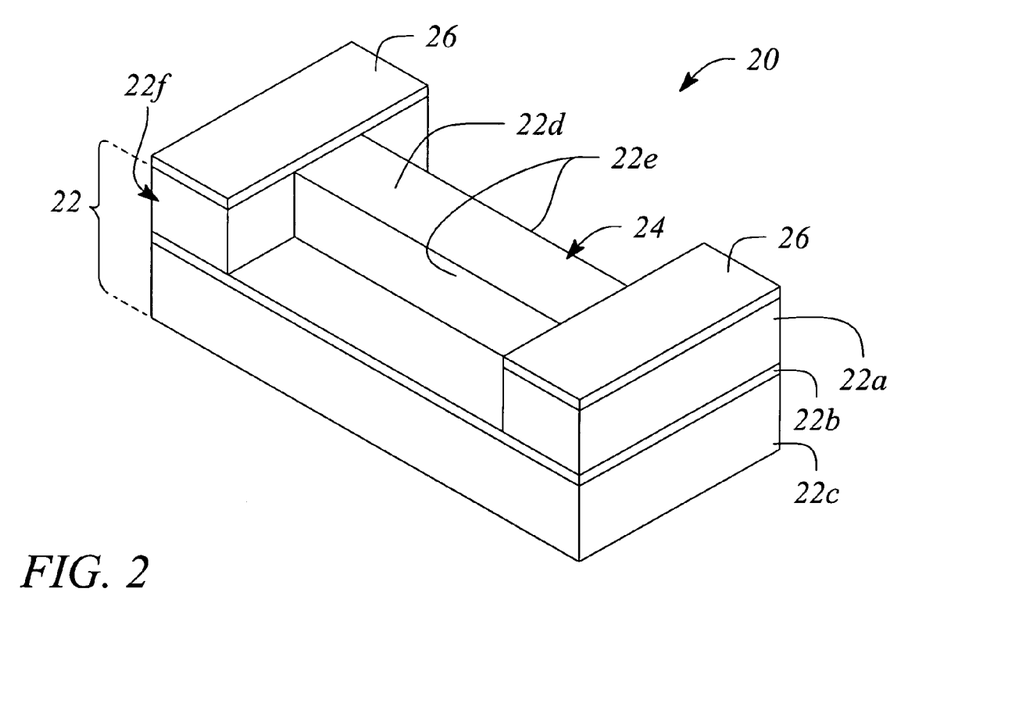
FIG. 2 illustrates a perspective view of an embodiment of a nano-scale device according to an embodiment of the present invention.

FIG. 2 illustrates a perspective view of an embodiment of a nano-scale device 20 in accordance with an embodiment of the present invention. The nano-scale device 20 comprises a semiconductor-on-insulator substrate 22 polished in a [110] direction. As mentioned above for the nano-scale structure 10 illustrated in FIGS. 1A and 1B, the semiconductor-on-insulator substrate 22 comprises a semiconductor layer 22a with a (110) horizontal planar surface 22d, an insulator layer 22b and a remainder, support layer of the substrate 22c. The insulator layer 22b is adjacent to and between the semiconductor layer 22a and the support layer 22c. The nano-scale device 20 further comprises a nanowire 24 wet chemically etched in the semiconductor layer 22a along (111) vertical lattice planes 22e of the semiconductor layer 22a. The nano-scale device 20 further comprises an electrical contact 26 at opposite ends of a nanowire length formed on mesas or islands 22f of the semiconductor layer 22a. As illustrated in FIG. 2, the nanowire 24 of this embodiment is much longer in length than a nanowire width or a nanowire height. The nanowire length is a design choice based on the intended use of the nano-scale device 20 and not a limitation herein. However, by increasing the length of the nanowire 24, a nanowire surface area is concomitantly increased. As such, the longer the nanowire 24, the more sensitive the nanowire 24 is to environmental changes adjacent to the device 20. Therefore, the device 20 illustrated in FIG. 2 may be a sensing device or sensor 20, depending on the embodiment.

Figure 3:
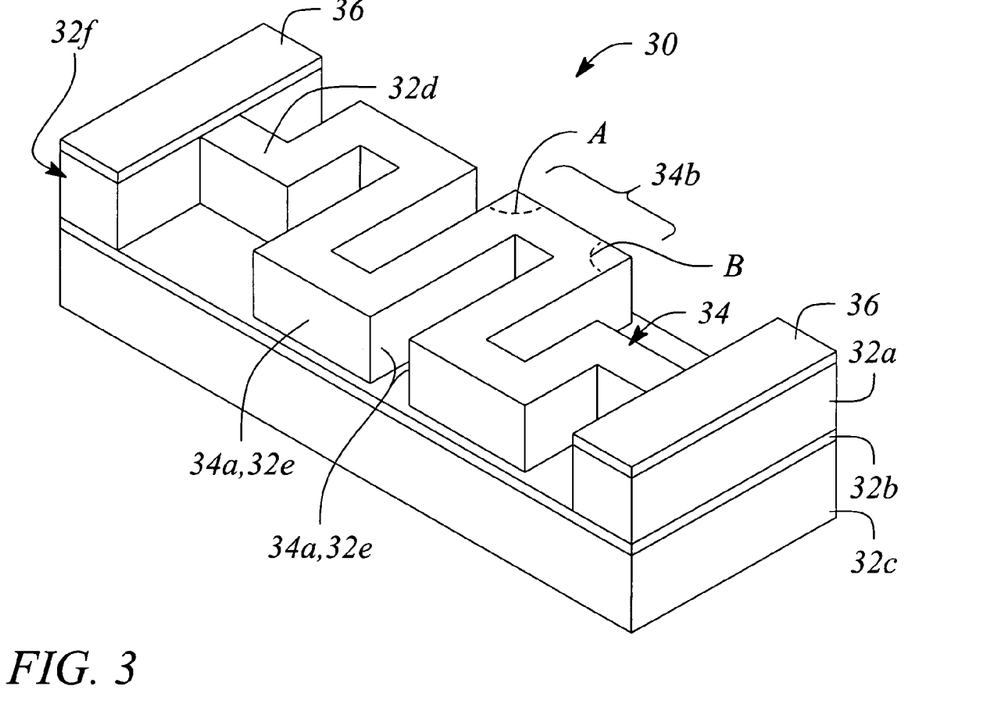
FIG. 3 illustrates a perspective view of another embodiment of a nano-scale device according to an embodiment of the present invention.

FIG. 3 illustrates a perspective view of an embodiment of a nano-scale sensor 30 with a meandered nanowire 34 between electrical contacts 36 in accordance with an embodiment of the present invention. The meandered nanowire 34 increases the nanowire surface area per unit sensor area and therefore, increases the nanowire sensitivity within the same sensor footprint. This embodiment takes advantage of the fact that the semiconductor wafer 32, 32a has a set of (111) vertical lattice planes 32e oriented in a first direction and a set of (111) vertical lattice planes 32e oriented in a second direction that are angularly spaced apart to intersect with each other (e.g., at angles A and B) as well as with the (110) horizontal plane 32d. During wet chemical etching of the semiconductor layer 32a along the (111) vertical lattice planes 32e, each meander section 34b of the nanowire 34 is aligned with the (111) vertical lattice planes 32e of both angularly spaced sets. For [110] polished silicon, the (111) vertical planes 32e are angularly spaced about 109 degrees and about 70 degrees apart (e.g., angle A=109.47 degrees and angle B=70.53 degrees in the silicon crystal structure). As such, each meander section 34b has characteristically atomically smooth sidewalls 34a in each angular direction, such that the meander sections 34b can be as little as nano-scale spaced apart without shorting between adjacent meander sections 34b.

Referring again to FIG. 2 and to FIG. 3, the electrical contacts 26, 36 are formed on and supported by isolated mesas or islands 22f, 32f of the semiconductor layer 22a, 32a, respectively. Each electrical contact 26, 36 is made conductive methods known in the art and described further below to provide an electrical connection to the semiconductor material of the nanowire 24, 34.

Figure 4:
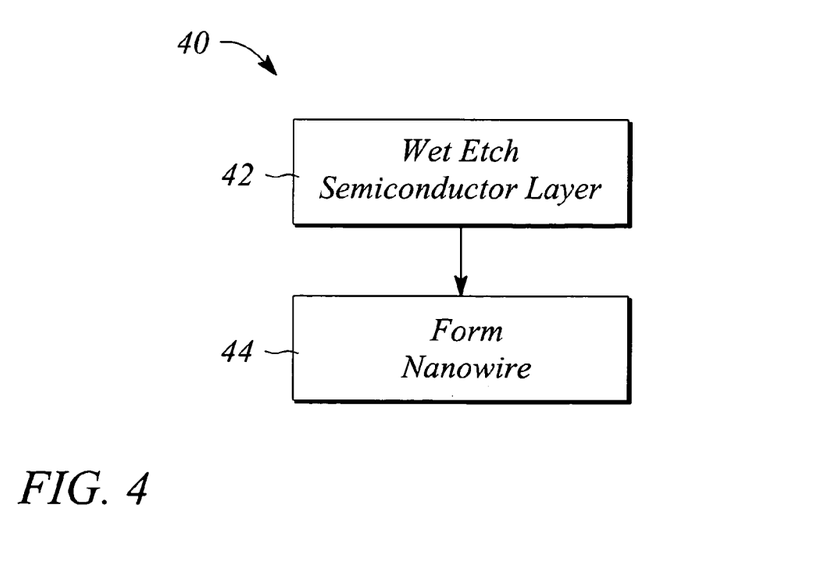
FIG. 4 illustrates a flow chart of an embodiment of a method of fabricating a nano-scale structure according to an embodiment of the present invention.

FIG. 4 illustrates a flow chart of an embodiment of a method 40 of fabricating a nano-scale structure according to an embodiment of the present invention. The method 40 of fabricating comprises wet etching 42 a semiconductor substrate, which is polished in a [110] direction, with a chemical etching solution to form 44 a nanowire in the semiconductor substrate. The etching solution anisotropically etches (111) vertical lattice planes of the semiconductor much slower than (110) horizontal lattice planes thereof, such that relatively deep trenches in the semiconductor layer are created along the (111) vertical lattice planes. Between adjacent trenches is the formed nanowire. As mentioned above for the structure 10 and the devices 20, 30, the semiconductor substrate wet etched 42 in the method 40 may be a semiconductor layer or wafer or a semiconductor-on-insulator wafer having the semiconductor layer. The nanowire extends vertically from a depth in the semiconductor layer to a (110) horizontal planar surface of the semiconductor substrate. In embodiments using a semiconductor-on-insulator wafer, the nanowire extends vertically from a depth of the insulator layer of the wafer. The nanowire has vertical sidewalls that are essentially atomically smooth (111) vertical lattice planes of the semiconductor layer. A nanowire may be relatively much longer than it is wide or deep and further, may be relatively much deeper than it is wide, depending on the embodiment. However, the shape and dimensions of the nanowire depend on the use of the nano-scale structure being fabricated. Such shape and dimensions of the nanowire are controlled by an etch mask and the parameters of the wet etching 42 process used, for example, which is described below.

For the purposes of the various embodiments of the present invention, the semiconductor material of the substrate or wafer has either a diamond crystal structure or a zinc blende crystal structure. Therefore, the term 'semiconductor', as used herein, is defined to mean a semiconductor material having either a diamond crystal structure or a zinc blende crystal structure. A semiconductor material with diamond crystal structures includes, but is not limited to a Group IV element, such as silicon (Si) and germanium (Ge), and includes a compound semiconductor of SiGe. Compound semiconductors with a zinc blende crystal structure include, but are not limited to, Group III-V elements, such as phosphides, arsenides and antimonides of any of aluminum, gallium and indium, for example, and Group II-VI elements, such as ZnS, CdS, CdTe and CdSe, for example.

While specific examples herein may be described with reference to 'silicon' as the semiconductor material, including a 'silicon-on-insulator' or 'SOI' wafer, it should be clear to those skilled in the art that any other semiconductor material, as defined above, may be substituted for silicon and still be within the scope of the various embodiments of the present invention. Moreover, reagents and parameters used for wet etching 42 and other processing of any other such semiconductor materials, in accordance with the methods disclosed herein, are known to those skilled in the art and may be substituted without undue experimentation.

References that provide materials and processes useful for processing other semiconductor materials in more detail include, but are not limited to, *Modern GaAs Processing Methods* by Ralph E. Williams, Artech House, (July 1990); *InP-Based Materials and Devices: Physics and Technology* by Osamu Wada (Editor), Hideki Hasegawa (Editor), Wiley-Interscience, (April 1999), pp. 295-309; *InP and Related Compounds: Materials, Applications and Devices* (Optoelectronic Properties of Semiconductors and Superlattices), M. O. Manasreh (Editor), Taylor & Francis, (Aug. 1, 2000); and *Physical Properties of III-V Semiconductor Compounds: InP, InAs, GaAs, GaP, InGaAs, and InGaAsP* by Sadao Adachi, Wiley-Interscience, (Sep. 1, 1992), each incorporated by reference herein. These and other references, such as *High-Speed Semiconductor Devices*, Edited by S. M. Sze, A Wiley-Interscience Publication, John Wiley & Sons, Inc., 1990, and S. M. Sze, *Physics of Semiconductor Devices*, Second Edition, John Wiley &Sons, 1981, also incorporated by reference herein, are readily available to those skilled in the art, such that other semiconductor materials, as defined above, may be used in the embodiments herein without undue experimentation.

Silicon wafers and SOI wafers that are polished in the [110] direction may be readily obtained from Isonics Corp., located in Golden, Colo. and Columbia, Md., having a website address of http://www.isonics.com. Another source for silicon wafers and SOI wafers polished in the [110] direction is SOITEC USA Inc., Peabody, Mass., having a website address of http://www.soitec.com. Wafers of the other above-defined semiconductor materials polished in the [110] direction also may be obtained from these sources or other sources known to those skilled in the art.

Wet etching 42 of a silicon layer may be accomplished by exposing the (110) horizontal planar surface of the silicon layer to an etching solution, such as a potassium hydroxide (KOH) solution, an ethylene diamine pyrocatechcol (EDP) solution, or a tetramethyl ammonium hydroxide (TMAH) solution, for example, each of which anisotropically etch silicon along (111) vertical planes. In an embodiment, the silicon is etched through an etch mask with an etching solution that comprises about 44 weight percent (wt. %) potassium hydroxide with the balance being water (KOH—$H_2O$) at a temperature of about 120 degrees Centigrade (° C.) that produces an etch rate of about 7 μm/min. The etch temperature may range from about room temperature or about 25° C.

to about 150° C., depending on the embodiment. Moreover, the concentration of the KOH solution may range from about 5 wt. % to about 70 wt. %, depending on the embodiment.

In another embodiment, the silicon is etched through an etch mask with an etching solution of EDP that comprises about 500 ml $NH_2(CH_2)_2NH_2$:about 88 g $C_2H_4(OH)_2$:about 234 ml $H_2O$ at a temperature of about 110° C. In still another embodiment, the silicon is etched through an etch mask with an etching solution of tetramethylammonium hydroxide (TMAH). TMAH allows for the use of different etch mask materials than those used with the KOH etching solution, as described further below.

Exposure to any one of such etching solutions removes silicon material anisotropically to create the trenches in the silicon layer as defined by the etch mask. For example, etching solutions, such as KOH, EDP, or TMAH attack or etch (111) vertical planes in the silicon substrate as much as one hundred times more slowly than they etch other planes, e.g., the (110) horizontal planes. As such, relatively deep narrow trenches can be produced with depth-to-width aspect ratios of almost 100:1 when etching the [110] polished silicon layer through an etch mask.

Moreover, adjusting the etching time along with solution concentration and temperature facilitates reaching a target depth. For most embodiments, the target depth is achieved when the silicon layer is etched to the insulator layer of the SOI wafer. The insulator layer is typically a silicon dioxide material or a silicon nitride material, for example. The insulator layer acts as a 'stop' to slow or essentially block further anisotropic etching by the KOH, EDP or TMAH, since none of these etching solutions effectively etch silicon dioxide or silicon nitride relative to the etching of silicon.

In another example, a GaAs compound semiconductor (a Group III-V zinc blende compound semiconductor) may be etched along (111) vertical planes using use a solution of $H_2SO_4$:$H_2O_2$:$H_2O$ in a ratio of about 1:1:100 (see for example, S. Hirose et al, *Appl. Phys. Letts.* 74 (1999) 964-966, incorporated herein by reference). Moreover, it is within the scope of the various embodiments described herein to use a combination of dry and wet etching processes for some semiconductor wafers, such as for a Group III-V compound semiconductor. For example, using vertical dry etching (e.g., RIE) followed by wet etching to smooth the dry-etched surface may be used for accessing (111) vertical planes.

According to the method 40, the vertical sidewalls of the formed nanowire have atomically smooth surfaces relative to vertical sidewalls etched with the conventional dry chemical etching process. In some embodiments, the wet etched 42 semiconductor layer further has reduced crystal structure damage relative to the semiconductor etched with the conventional dry chemical etch process, such as RIE. The resultant nano-scale structure fabricated by the method of the present invention is more reliable and durable than a nanoscale structure fabricated conventionally, as discussed above.

The number of nanowires that may be wet etched 42 into the wafer during the method 40 is dependent on a final nanoscale structure to be fabricated and is not considered a limitation herein. The final nano-scale structure achieved is limited by one or more of the capability of the etching and/or lithographic technologies used and further, the atomic spacing of the (111) vertical lattice planes in the semiconductor, for example.

Wet etching 42 comprises masking the (110) horizontal surface with an etch mask having a pattern to be etched. In some embodiments, a mask material is deposited and/or grown on the (110) horizontal surface of the wafer. A typical mask material is a thermal oxide layer of the semiconductor material, for example a silicon dioxide layer on the exemplary silicon wafer or SOI wafer. Silicon dioxide works well as an etch mask material when using the KOH etching solution. The thermal oxide layer of silicon dioxide may be grown on the (110) horizontal surface of the exemplary wafer according to known techniques using heat and, in some embodiments, the introduction of oxygen in a controlled atmosphere for the purposes of the method 40. Alternatively or additionally, an oxide layer can be deposited on the silicon using plasma enhanced chemical vapor deposition (PECVD) at about 400° C., for example. A thermal oxide layer is more resistant to the KOH wet etching solution than the PECVD oxide layer, for example.

In other embodiments, the masking layer is selected from an oxide material, a polymer material and a composite material that resists attack by the etchant solution used for anisotropically etching the semiconductor wafer. For example, the oxide, polymer or composite masking layer will resist one or more of KOH, EDP and TMAH attack during etching of the silicon or SOI wafer. Mask materials are known to one skilled in the art, such that a masking material for a given etching solution is readily determined without undue experimentation. The oxide, polymer or composite masking layers may be deposited or applied by spin coating onto the (110) horizontal surface, for example, using known techniques. Using wet etching 42 and any one of these masking layer materials instead of a metal etch mask reduces, if not essentially eliminates, metal ion contamination of the semiconductor layer relative to a semiconductor layer that is conventionally dry chemical etched through a metal etch mask.

Once grown and/or deposited, the masking layer is patterned to serve as the etch mask for subsequent wet etching 42 of the semiconductor wafer to form the nano-structure. As used herein, 'patterning' or 'patterned' refers to defining and producing a final pattern, or a final pattern defined and produced, in the masking layer, for example. As such, 'patterning' or 'patterned' is not limited to any process used to so define and produce such a final pattern. In particular, in some embodiments patterning the masking layer may comprises any technique including, but not limited to, photolithography, imprint lithography and electron-beam lithography, along with an applied resist (e.g., photoresist) or similar masking material or masking process, or ion milling, for example. With such patterning, a portion of the masking layer is selectively or nonselectively removed by one or both of dry and wet chemical etching, for example. In some embodiments, dry chemical processing such as, but not limited to, using plasmas (e.g., RIE) or ion beams, may be employed to etch a pattern in the masking layer.

For example, RIE may be employed to selectively etch the masking layer. In some embodiments using a thermal oxide masking layer, a photoresist mask is patterned on the exemplary oxide masking layer using conventional photolithography techniques that are known in the art. Then trifluoromethane ($CHF_3$) and Argon (Ar) gases are used in RIE to pattern the oxide masking layer through the photoresist mask, for example. Once the oxide masking layer is patterned with RIE, the photoresist mask is removed using known techniques.

Selective removal of portions of the masking layer (i.e., patterning) creates the etch mask for later processing 42 of the semiconductor wafer. The etch mask exposes selected portions of the underlying (110) horizontal surface of the semiconductor wafer or substrate while leaving other portions unexposed or protected from wet etching 42 the semiconductor wafer. Mask edges defined by the etch mask establish locations on the (110) horizontal surface where the nanowire sidewalls will be etched 42 in the semiconductor wafer. In particular, the edges of the etch mask lie along, or are aligned with, the intersection of one or more (111) vertical lattice planes with the (110) horizontal surface of the wafer. The wafer is subsequently wet etched 42 along the edges of the etch mask from the exposed (110) surface portion along the (111) vertical planes, as described above. For additional information and illustrations of the wet etching process, see for example, co-pending patent application of M. Saif Islam et al., Ser. No. 10/826,056, filed Apr. 16, 2004, entitled "Apparatus for Imprinting Lithography and Fabrication Thereof", incorporated herein by reference.

The wet etched semiconductor wafer essentially has parallel trenches, each with sidewalls and a bottom. A trench sidewall is a (111) vertical planar sidewall of the formed nanowire. The trench separates the nanowire from adjacent or parallel structures etched in the semiconductor wafer, such as other nanowires, in that the trench has a width or space between the trench sidewalls. Where the semiconductor-on-insulator wafer is used, the trench bottom is the insulator layer of the semiconductor-on-insulator wafer. The insulator layer of the trench bottom electrically isolates the nanowire from the parallel or adjacent nanostructures. The trench bottom is approximately horizontal or laterally extending relative to the trench vertical sidewalls. The trench bottom is essentially planar due to the insulator layer of the wafer. Where the semiconductor wafer is used, the trench bottom is the semiconductor material of the wafer. Electrical isolation may be achieved with wider trenches to increase the space between adjacent nanowires or other nano-structures. The trench bottom in the semiconductor wafer is approximately V-shaped or U-shaped relative to the planar trench bottom of the semiconductor-on-insulator wafer.

When wet etching 42 is complete, the etch mask is removed. For example, a thermal oxide etch mask is removed using hydrofluoric acid (HF), according to known techniques of oxide removal.

FIGS. 1A, 1B and 1C are illustrative of the formed 44 nanowire structures that may be achieved upon completion of wet etching 42 according to some embodiments of the method 40. The nanowire width and trench width essentially dictate a pitch of adjacent or parallel nano-scale structures. In some embodiments, the pitch of adjacent nanowires may range from about 10 nm to about 200 μm, for example. FIGS. 1A, 1B and 1C further illustrate the relative shapes of the respective trench bottoms, depending on the wafer type.

Figure 5:
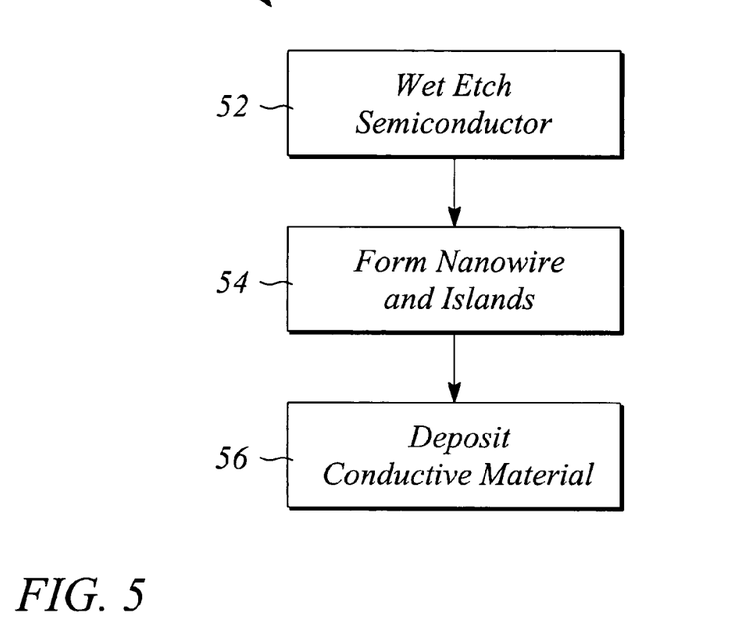
FIG. 5 illustrates a flow chart of an embodiment of a method of fabricating a nano-scale device according to an embodiment of the present invention.

FIG. 5 illustrates a flow chart of an embodiment of a method of fabricating a nano-scale device according to an embodiment of the present invention. The method 50 of fabricating a nano-scale device comprises wet etching 52 a semiconductor layer of a semiconductor-on-insulator wafer. The method 50 of fabricating is similar to that described above for the method 40 of fabricating a nano-scale structure except that the semiconductor layer is wet etched 52 to form 54 both a nanowire and semiconductor islands or mesas at opposite ends of the nanowire. In some embodiments, the semiconductor islands are formed simultaneously with the nanowire. In other words, the semiconductor islands are wet chemical etched 52 in the semiconductor layer simultaneously with wet etching 52 of the nanowire. Simultaneous formation 54 of the semiconductor islands with the nanowire is achieved by using an etch mask pattern that includes the islands with the nanowire pattern. In these embodiments, the semiconductor islands may be formed along (111) vertical lattice planes with the nanowire, as well as (111) vertical lattice planes that intersect the nanowire (111) vertical planes, as further described with respect to FIG. 3. In other embodiments, the semiconductor islands are formed 54 separately from the nanowire. Such separate formation 54 allows for the use of a different etch mask and/or a different etching process or etching material, if desired, relative to the wet etching process 52 used to form 54 the nanowire.

The semiconductor islands essentially are supports for an electrical connection to the nanowire. The method 50 of fabricating a nano-scale device further comprises depositing 56 an electrically conductive material on the (110) horizontal surface of the semiconductor islands to form an electrical connection to each end of the semiconductor nanowire. The conductive islands are essentially isolated electrical contacts or pads for measuring or monitoring electrical or physical characteristics of the nanowire. In some embodiments, depositing 56 the conductive material may be accomplished with one or more sputtering, evaporation, chemical vapor deposition and molecular beam epitaxy, for example. A conductive material including, but not limited to, one or more of gold, silver, aluminum, copper, platinum, nickel and a metal-semiconductor alloy, may be used to form the electrical contacts. For silicon or SOI wafers, a metal-silicide alloy, including but not limited to titanium-silicide, may be used to form the electrical contacts. Alternatively, a conductive nonmetal material including, but not limited to a highly doped polysilicon, also may be used for the electrical contacts. Such nonmetals are deposited on the surface of the islands using CVD or e-beam evaporation followed by thermal annealing. Moreover, gold may be deposited on a GaAs semiconductor material using a rapid thermal process and annealing. The above-mentioned deposition processes and materials, and methods for patterning using lithography or other patterning techniques to form the electrically conductive islands are known to those skilled in the art. These techniques and other materials and processes, which are readily devised by the skilled artisan, are within the scope of the embodiments of the present invention.

In some embodiments, the method 50 is used to fabricate the nano-scale device 20, 30, illustrated in FIGS. 2 and 3. The fabricated nano-scale device is available for any number of uses. Depending on the nanowire characteristics, one or both of electrical responses and physical responses to the environment can be measured or monitored for changes and correlated to a variety of environmental conditions to be sensed or detected. Moreover, the nano-scale device can be operated as a switch, a diode, or an amplifier or a component of an electronic circuit, for example.

Figure 6:
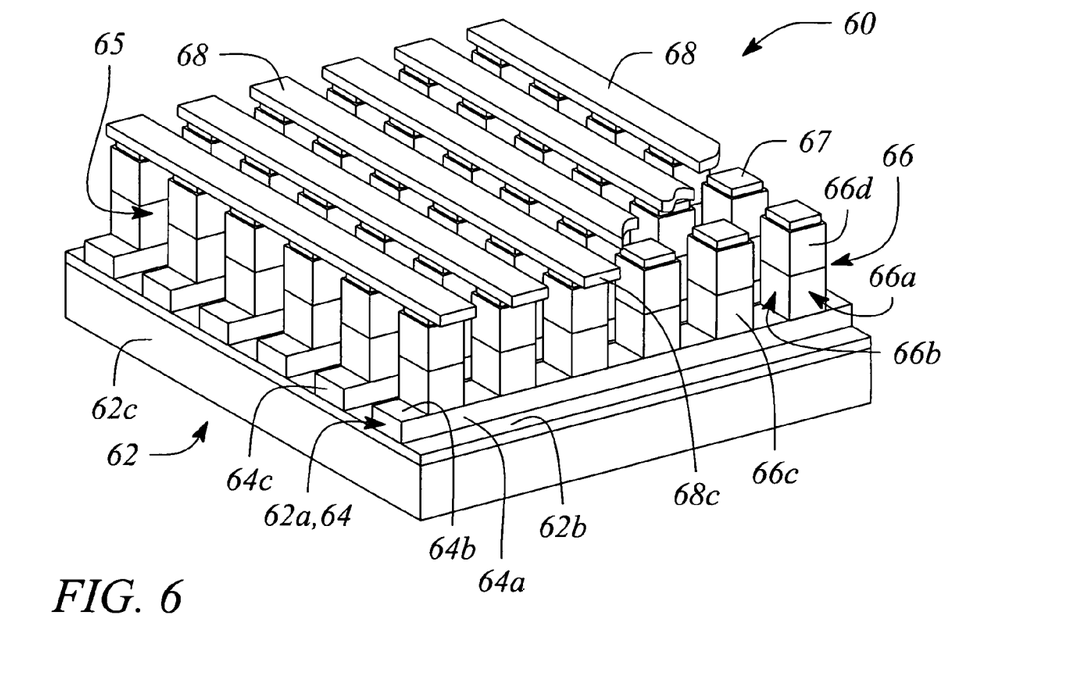
FIG. 6 illustrates a perspective view of an embodiment of a nano-pn junction diode array according to an embodiment of the present invention.

In other embodiments, the fabricated nano-scale device is a nano-diode. FIG. 6 illustrates a perspective view of an embodiment of a nano-pn diode array 60 according to an embodiment of the present invention. The nano-pn diode array 60 comprises a semiconductor substrate 62 polished in the [110] direction. The semiconductor substrate 62 is a semiconductor-on-insulator wafer, as defined above, wherein the diode array 60 is formed in a semiconductor layer 62a of the wafer 62 that is on an insulator layer 62b and support layer 62c of the wafer 62.

The nano-pn diode array 60 further comprises a set of first nano-electrodes 64 in the semiconductor layer 62a. The first nano-electrodes 64 are essentially nanowires, such as the nanowire 14, 24 of the nano-scale structure 10 or nano-scale device 20, as described above. The set of first nano-electrodes 64 are adjacent the insulator layer 62b of the wafer 62. Each first nano-electrode 64 of the set is spaced apart or electrically isolated from an adjacent first nano-electrode 64. The first nano-electrodes 64 are longer than they are wide or tall and are oriented parallel to each other in FIG. 6. Moreover, the first nano-electrodes 64 have vertical sidewalls 64a that are (111) vertical lattice planes of a first set (111) vertical lattice planes in the semiconductor crystal structure. The first nano-electrodes 64 are wet chemically etched in the semiconductor layer 62a along the first set of (111) vertical planes of the semiconductor layer 62a. As such, the vertical sidewalls 64a of the first nano-electrodes 64 are atomically smooth or planar at least due to the wet chemical etching, such that the first nano-electrodes 64 may be closely spaced without electrically shorting together.

The first nano electrodes 64 have smoother vertical sidewalls relative to a nano-scale structure that is dry chemically etched, such as with RIE. Moreover, the first nano-electrodes 64 have less crystal damage relative to a nano-structure that is etched using dry chemical etching. Moreover, the first nano-electrode 64 has much less metal ion contamination relative to a nano-structure formed conventionally using dry chemical etching and a metal mask.

The first nano-electrode 64 is a highly doped semiconductor that renders the first nano-electrode 64 more electrically conductive relative to a semiconductor that not highly doped (i.e., lightly doped, doped, or not doped). In some embodiments, the first nano-electrode 64 is highly doped with an n-conduction type dopant. In other embodiments, the first nano-electrode 64 is highly doped with a p-conduction type dopant. The p- or n-conduction types are known to those skilled in the art, as well as dopant concentrations to produce a highly doped semiconductor. For example, the dopant concentration of a highly doped semiconductor may range from about $10^{18}$/cm$^3$ to about $10^{21}$/cm$^3$.

The nano-pn diode array 60 further comprises a set of nano-pn junctions 66 vertically adjacent to the first nano-electrode 64. As illustrated in FIG. 6, each first nano-electrode 64 has a set of nano-pn junctions 66 vertically adjacent to (or stacked upon) a horizontal surface 64b of the electrode 64. The set of nano-pn junctions 66 have parallel first vertical sidewalls 66a that share the same (111) vertical planes of the first set as the (111) vertical planes of the vertical sidewalls of the first nano-electrode 64. The set of nano-pn junctions 66 further have opposing second vertical sidewalls 66b along vertical planes that intersect with the first set of the (111) vertical planes.

In some embodiments, the opposing second vertical sidewalls 66b are parallel (111) vertical planes of a second set of (111) vertical lattice planes of the semiconductor 62a material. The second set of (111) vertical planes intersects the first set of (111) vertical planes at an angle, such as angles A and B described previously with respect to FIG. 3, for example. For a silicon semiconductor, such intersecting (111) vertical planes intersect at about 109 degrees (angle A) and about 70 degrees (angle B). Such parallel vertical sidewalls 66b are formed using wet chemical etching similar to the vertical sidewalls 66a, as is further described below with respect to a method 70 of fabrication.

Figure 7:
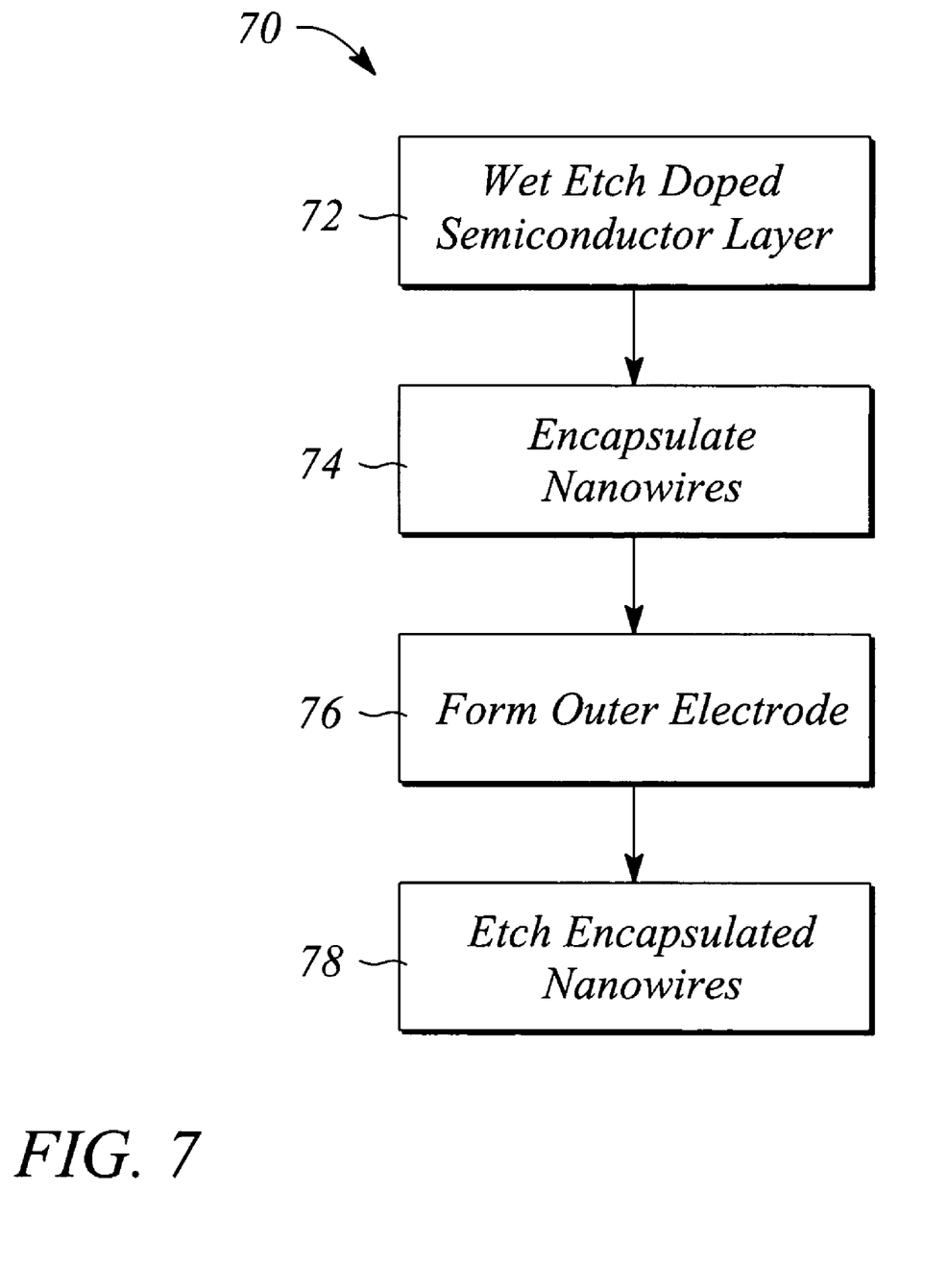
FIG. 7 illustrates a flow chart of an embodiment of a method of fabricating a nano-pn diode according to an embodiment of the present invention.

In other embodiments, the opposing second vertical sidewalls 66b are adjacent to (111) vertical planes of the second set of (111) vertical lattice planes. The vertical sidewalls 66b of these other embodiments are formed using a dry etching process, as is further described below with respect to the method 70 of fabrication. As a result, each nano-pn junction 66 has two pairs of opposing vertical sidewalls 66a, 66b, as described above.

As illustrated in FIG. 6, a respective set of nano-pn junctions 66 appear vertically stacked upon each first nano-electrode 64. For simplicity only, each first nano-electrode 64 may be referred to herein as a 'column' of the nano-pn diode array 60, and each nano-pn junction 66 on the nano-electrode 64 may be referred to herein as a 'row' that intersects the columns of the nano-pn diode array 60.

The set of nano-pn junctions 66 has at least atomically smooth vertical sidewalls 66a as a result of the wet chemical etching. The vertical sidewalls 66b may also be atomically smooth, depending on the embodiment. At least having the wet-etched, atomically smooth or planar (111) vertical sidewalls 66a renders such pn-junctions 66 smoother or more planar than nano-pn junctions that are conventionally formed by dry chemically etching. Moreover, the set of nano-pn junctions 66 further has reduced crystal damage and little metal ion contamination relative to pn-junctions formed using conventional dry chemical etching and a metal etch mask.

Each nano-pn junction 66 of the set comprises a first junction layer 66c immediately adjacent the horizontal surface 64b of the first nano-electrode 64. The first junction layer 66c is doped with the same conduction type as the first nano-electrode 64. Each nano-pn junction 66 of the set further comprises a second junction layer 66d adjacent to the first junction layer 66c in the vertical stack, that is doped with the opposite conduction type. For example, when the first nano-electrode 64 is highly doped with an n-type dopant, the first junction layer 66c may be also highly doped or lightly doped with an n-type dopant. The second junction layer 66d is lightly doped with a p-type dopant. In some embodiments, the dopant concentration of the first junction layer 66c ranges from about $5\times10^{15}$/cm$^3$ to about $10^{18}$/cm$^3$. The dopant concentration of the second junction layer 66d ranges from about $5\times10^{15}$/cm$^3$ to about $10^{18}$/cm$^3$. These ranges of dopant concentration are provided herein as nonlimitive examples. One skilled in the art is familiar with doping concentrations to achieve various conduction levels. All such doping concentrations are within the scope of the embodiments of the present invention.

The nano-pn diode array 60 further comprises a nonconductive support material in a space 65 between adjacent nano-pn junctions 66 of the same row (i.e., between nanowire columns in each row of nano-pn junctions 66) that extends from the insulator layer 62b to approximately adjacent a height of the nano-pn junctions 66. In some embodiments, the nonconductive support material may further be between nanowire rows where it extends from the insulator layer 62b to a height that is below the interface or junction between the first and second nano-pn junction layers 66c, 66d (not illustrated). The nonconductive support material is selected from an oxide or nitride of the semiconductor material of the wafer 62 or a nonconductive polymer or composite material having sufficient rigidity to function as a support material at least in the temperature range of operation of the nano-pn diodes of the array 60. For an SOI wafer, the nonconductive support material includes, but is not limited to, one of silicon dioxide, silicon nitride, glass and benzocyclobutane (BCB) polymer, for example.

In some embodiments, the nano-pn diode array 60 may further comprise an optional material layer 67 on the nano-pn junctions 66 vertically adjacent to the second junction layer 66d opposite to the first junction layer 66c. The optional layer 67 is included in some embodiments of the nano-pn diode array 60 to modify or enhance the operation of the diodes of the array 60. FIG. 6 illustrates the optional layer 67 by way of example only and not by way of limitation.

The optional layer 67 may comprise a switching molecule, such as an electrically addressable molecular species, as described in U.S. Pat. No. 6,459,095 B1, for example, which is incorporated herein by reference in its entirety. Also see for example, Yong Chen et al., "Nanoscale Molecular-Switch Devices Fabricated by Imprint Lithography", *Applied Physics Letters*, Vol. 82, No. 10, (10 Mar. 2003) pp. 1610-1612, also incorporated herein by reference in its entirety.

The nano-pn diode array 60 further comprises a set of second nano-electrodes 68 adjacent to the horizontal surface of the nano-pn junction 66. In the embodiments that also include the optional layer 67, the layer 67 is between the junction 66 horizontal surface and the set of second nano-electrodes 68. A second nano-electrode 68 of the set comprises an elongated strip or bar of electrically conductive material that extends along a 'row' of pn-junctions 66 in the nano-pn diode array 60. In some embodiments, the second nano-electrode 68 extends in a direction at the intersecting angle B to a direction of the first nano-electrodes 64. Each second nano-electrode 68 essentially crosses over the first nano-electrodes 64 of the set along a respective row of nano-pn junctions 66. The nonconductive support material in the space 65 at each row between the columns physically supports the set of second nano-electrodes 68 in areas where the electrodes 68 effectively bridge across adjacent nano-pn junctions 66 in a row. In some embodiments, the second nano-electrode 68 is made of a metal material, such as one or more of aluminum, gold, silver, copper, platinum, and nickel, or other metals available to those skilled in the art. For silicon semiconductors, a titanium-silicide alloy alternatively may be used, for example. In other embodiments, the second nano-electrode 68 is made from a nonmetal that is rendered electrically conductive. For silicon semiconductors, a nonmetal, such as a highly doped polysilicon material, may be used, for example.

The set of second nano-electrode 68 'cross-bars' and the embedded set of first nano-electrode 64 nanowires are accessible externally to address one or more individual nano-pn junctions 66 in the nano-pn diode array 60 at a time (e.g., by column and row). The nano-pn diode array 60 may further comprise a conductive trace or lead (i.e., pins) connected to or continuous with an end 64c, 68c of individual ones of the first nano-electrode 64 and the second nano-electrode 68, respectively. The conductive traces or leads extend externally from the diode array 60 for probing or addressing selected nano-pn junctions 66 of the array 60.

Conventional nano-pn diodes tend to have low device performance caused by the p and n layers in the semiconductor being too thin. The p and n layers can not be made thick enough conventionally to improve the device performance due to conventional fabrication techniques. Conventional processing, which includes RIE, a metal etch mask, planarization with chemical and mechanical polishing (CMP), etc., renders fabrication using thicker p and n layers extremely challenging. According to embodiments of the present invention, a semiconductor material polished in the [110] direction that is wet chemical etched along (111) vertical lattice planes of the semiconductor crystal structure improve both the device performance and reliability, and further render fabrication thereof easier relative to the conventional nano-pn diodes. For example, the p and n layers are sufficiently thick for better performance and quality of the diode, while the width of the pn junctions (i.e., the width of the nanowire) is much smaller than the thickness. Moreover, the wet chemical etched semiconductor materials provide atomically smooth vertical sidewalls that are the (111) vertical planes. Therefore, pn junctions and electrodes can be independently closer spaced in the diode array 60, while avoiding electrical shorting. Moreover, the crystal structures of such wet chemical etched semiconductors, by definition, are not damaged by dry chemical etching with RIE. Furthermore, such wet chemical etched semiconductors, by definition, are not contaminated with metal ions by metal etch masks during RIE. The nano-pn diode array 60 of the present invention is more reliable from a performance standpoint, more structurally reliable and also easier to fabricate than conventional nano-pn diodes.

FIG. 7 illustrates a flow chart of an embodiment of a method 70 of fabricating a nano-pn diode array according to an embodiment of the present invention. The method 70 of fabricating comprises wet etching 72 a doped semiconductor layer of a semiconductor-on-insulator wafer polished in the [110] direction along a first set of (111) vertical lattice planes. The semiconductor-on-insulator wafer comprises the doped semiconductor layer, an inner insulator layer and a remainder or support layer of the wafer. The doped semiconductor layer is wet etched 72 from a (110) horizontal planar surface to the insulator layer. As a result of wet etching 72, a set of spaced apart, parallel nanowires is formed having a height equal to the thickness of the semiconductor layer. Each nanowire of the set has parallel vertical sidewalls that are (111) vertical planes of the first set. A width and pitch of each nanowire are each independently in a nano-scale range.

The doped semiconductor layer comprises an innermost sub-layer of the semiconductor layer, a middle sub-layer of the semiconductor layer, and an outer sub-layer adjacent to the middle sub-layer. The innermost sub-layer is adjacent to the insulator layer of the wafer and has a first dopant concentration of a first conduction type. The middle sub-layer is adjacent to the innermost sub-layer and has a second dopant concentration of the first conduction type. The outer sub-layer has a third dopant concentration of a second conduction type. The first dopant concentration ranges from about $10^{18}/cm^3$ to about $10^{21}/cm^3$ or another concentration understood by those skilled in the art as equivalent to a highly doped semiconductor. The second dopant concentration and the third dopant concentration independently range from about $10^{15}/cm^3$ to about $10^{18}/cm^3$ or another concentration understood by those skilled in the art as equivalent to a lightly doped semiconductor. In some embodiments, the second dopant concentration may be 'highly doped' or essentially equivalent to the first dopant concentration.

In some embodiments, the semiconductor-on-insulator wafer may be purchased pre-doped according to the description above. In other embodiments, the method 70 further comprises doping the semiconductor layer using standard techniques for doping known in the art, such as using ion implantation of boron or phosphorus.

Referring again to FIG. 7, the method 70 of fabricating further comprises embedding or encapsulating 74 the set of nanowires in an encapsulant material. Encapsulating 74 comprises applying the encapsulant, and removing the encapsulant along a parallel horizontal plane until a (110) horizontal surface of the set of nanowires is exposed. The applied encapsulant fills in between adjacent parallel nanowires of the set. The encapsulant protects the nanowires during subsequent processing and further provides a support function to an outer electrode of the diode array, as described further below. The encapsulant is sufficiently rigid in solid or cured form and remains rigid during subsequent processing and in a temperature range of operation of the diode array.

The encapsulant may be grown or deposited using CVD or PECVD, for example, or spun coated on the surface, depending on the encapsulant material and the embodiment. The techniques for applying are known to those skilled in the art. The encapsulant material includes, but is not limited to, an oxide material, a nitride material, a composite material, and a polymer material. A spun-on glass and benzocyclobutane (BCB) are examples of some materials that are useful as the encapsulant. For a silicon-on-insulator wafer, also either silicon dioxide or silicon nitride is useful as the encapsulant material.

In some embodiments, one or both of chemical polishing and mechanical polishing, according to techniques familiar to those skilled in the art, is used to remove the encapsulant along the horizontal plane parallel to the (110) horizontal plane until the (110) horizontal surface of the nanowires is exposed. In other embodiments, the encapsulant is etched back to expose the (110) horizontal surface of the nanowires using known techniques. The (110) horizontal surface of the set of nanowires is exposed for subsequent processing, as described below.

In some embodiments, the method 70 of fabricating may further comprise applying a material layer to the (110) horizontal surface of the embedded nanowires to alter, modify or enhance the function or operation of a diode of the array. A switching molecule, such as that mentioned above with respect to U.S. Pat. No. 6,459,095 B1, may be used, for example and not by way of limitation. The use of a material layer in the diode array is optional for the method 70. The optional material may be applied as a Langmuir-Blodgett film or a self-assembled monolayer (SAM) on the exposed (110) horizontal surface, depending on the embodiment. One skilled in the art is familiar with Langmuir-Blodgett film and SAM deposition or growth.

Referring again to FIG. 7, the method 70 of fabricating further comprises forming 76 a set of outer electrodes on the horizontal surface of the embedded nanowires, such that an outer electrode of the set extends across the encapsulant between nanowires to bridge and make contact with the exposed (110) horizontal surfaces of the set of nanowires, and/or with the corresponding optional material thereon, if included. The set of outer electrodes may be formed 76 using any techniques for applying, growing or depositing and patterning a electrically conductive material on the surface, known or available to those skilled in the art, that ultimately provide a set of spaced apart electrode cross-bars (representing rows) that intersects with the set of embedded nanowires (representing columns) along the nanowire length. Such techniques include, but are not limited to, evaporation, sputtering, CVD, PECVD, e-beam, SAM growth or other selective or nonselective deposition techniques mentioned herein, and any available lithographic process for patterning, for example.

The method 70 of fabricating further comprises etching 78 the encapsulated nanowire using the set of electrode cross-bars as a mask to form a pn-diode on the nanowire at a location where an electrode cross-bar of a row and a nanowire of a column cross. The individual diodes each have a pn-junction formed from a portion of the embedded nanowire. The portion of the nanowire that forms the pn-junctions of the individual diodes comprises the outer sub-layer and the middle sub-layer of the doped semiconductor layer, described above.

In some embodiments, a dry chemical etching process is used to etch 78 both the semiconductor material of the nanowire and the encapsulant between the rows of electrode cross-bars essentially simultaneously to form the diodes. RIE or other dry etching techniques known in the art may be used for etching.

In another embodiment, a wet chemical etching process is used to etch 78 the semiconductor nanowires, but not the encapsulant. In this embodiment, both the electrode cross-bars and the encapsulant essentially provide a mask for wet etching. The wet chemical etching techniques described above may be used for etching with the additional benefit of etching along a second set of (111) vertical planes of the semiconductor layer angularly spaced to intersect with the first set of (111) planes that formed the nanowires. After wet etching 78 to form the diodes according to this embodiment, the encapsulant remaining between rows optionally may be removed with either a wet etching process or dry etching process, such as RIE or another dry etching process. Therefore, one or both of a wet etching process and a dry etching process may be used for the selective removal of the encapsulant and the nanowire material between rows.

During etching 78 to form the individual diodes, the nanowires and encapsulant are etched 78 from between the electrode cross-bar rows to at least a depth below an interface between the middle sub-layer and the outer sub-layer of the nanowires (i.e., below the pn-junction), as measured from the (110) horizontal surface. By removing some of the encapsulant between the rows, any inherent dielectric characteristics and/or other characteristics of the encapsulation material do not interfere with the operation of the pn-diodes. In other words, some amount of encapsulant may remain between the rows of pn-diodes in some embodiments, but not enough to detrimentally affect diode performance. Importantly, the encapsulant between the pn-diodes in a row is not removed, such that the encapsulant provides a rigid support for the bridging electrode cross-bars in each row.

The method 70 of fabricating a nano-pn diode array provides pn-junction diodes that are individually accessible or addressable by probing the electrodes of a row and a column of the array. The semiconductor nanowires have the sub-layer with the first dopant concentration and further has a nanowire length that is longer than the nanowire is wide or deep (thick). Each of the semiconductor pn-junctions has the sub-layer with the second dopant concentration and the sub-layer with the third dopant concentration in a stacked-layer relationship. Each pn-junction is a fraction of the length of the semiconductor nanowire, but approximately the same width as the nanowire.

In some embodiments, the method 70 is used to fabricate the nano-pn diode array 60 illustrated in FIG. 6. The method 70 allows for the use of thicker dopant sub-layers of the semiconductor than useable with conventional fabrication methods using RIE instead of wet etching to fabricate the diode structures. Thicker sub-layers provide for more reliable diode structures, both structurally and performance-wise. Moreover, the less the RIE dry etch process is used during fabrication of the diodes, the less crystal structure damage results to the semiconductor material of the diode array. In addition, wet chemical etching of [110]-polished semiconductors takes advantage of anisotropic etching along (111) vertical lattice planes of the semiconductor, as described herein, and provides for more densely populated nano-scale structures in a given space without sacrificing device reliability.

In another embodiment of the method 70 (not illustrated), wet etching 72 the doped semiconductor layer further comprises forming a set of pn-junction vertical pillars on the set of nanowires. The semiconductor layer is further wet etched along a second set of (111) vertical lattice planes that intersect with the first set of (111) planes to form the pn-junction pillars. The doped semiconductor layer is wet etched along the second set of (111) planes from the (110) horizontal surface to approximately a horizontal interface between the innermost sub-layer and the middle sub-layer in some embodiments. In other words, the interface defines where a change exists in dopant concentration from the first dopant concentration to the second dopant concentration in the semiconductor layer. In other embodiments, the interface defines where a change exists in dopant concentration from the first dopant concentration to the third dopant concentration (e.g., where the first dopant concentration and the second dopant concentration are approximately equivalent).

The second set of (111) vertical planes may be etched either simultaneously with or subsequent to the etching of the first set of (111) planes. As a result, both the set of semiconductor nanowires is formed, having parallel (111) vertical sidewalls of the first set of (111) vertical planes, and a set of pn-junction vertical pillars are formed on a horizontal surface of the formed nanowires during wet etching 72. The pn-junction pillars are spaced apart from one another on a respective nanowire and have both a pair of opposing (111) vertical sidewalls of the first set and a pair of opposing (111) vertical sidewalls of the second set, and further have a (110) horizontal surface at a free end of the vertical pillar.

After wet etching 72 according to this embodiment of the method 70, the etched structures are encapsulated, as described above for encapsulating 74, and further have the outer electrode formed thereon, as described above for forming 76. However, in this embodiment, the set of outer electrodes are formed across rows of the pn-junction vertical pillars to contact the (110) horizontal surface of the free ends, since the pn-junction pillars are already formed. Moreover, in this embodiment of the method 70, rather than etching 78 both the encapsulant and nanowire material within the rows of outer electrodes to form the diodes, only the encapsulant is etched between rows for the reasons stated above.

As a result, the embedded nanowires electrically connect adjacent pn-junction pillars on the same nanowire together as columns and the electrode cross-bars electrically connect adjacent pn-junction pillars on adjacent nanowires together as rows. The interconnected pn-junctions form an array of pn-diodes each accessible by column and row. This embodiment takes advantage of using only wet chemical etching to form the pn-diodes of the array. A dry etching process may be used, but is limited to removal of encapsulant after the pn-diodes are formed.

Thus, there have been described embodiments of a nano-scale structure, a nano-scale device, a nano-pn diode and methods of fabrication thereof. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nano-scale electrical sensor comprising:
a semiconductor-on-insulator substrate having a [110] crystal direction;
a semiconductor nanowire sensing element having vertical sidewalls that are (111) vertical lattice planes of the substrate, the (111) vertical sidewalls extending from a (110) horizontal surface to an insulator layer of the substrate; and
an electrical contact at opposite ends of the nanowire sensing element,
wherein the (111) vertical sidewalls are atomically smooth to facilitate sensing, the atomical smoothness of the (111) vertical sidewalls being smoother than a dry chemical-etched surface.

2. The nano-scale electrical sensor of claim 1, wherein the nanowire sensing element is spaced apart from other nanowire sensing elements along other parallel ones of the (111) vertical lattice planes of the substrate, such that each nanowire sensing element has atomically smooth vertical sidewalls to facilitate sensing.

3. The nano-scale electrical sensor of claim 1, wherein the atomically smooth (111) vertical sidewalls further have reduced crystal structure damage relative to the dry chemical-etched surface to facilitate sensing.

4. The nano-scale electrical sensor of claim 1, wherein the vertical sidewalls of the nanowire sensing element are (111) vertical lattice planes of a (110) semiconductor layer of the substrate, the (110) semiconductor layer being selected from a semiconductor or a compound semiconductor from Group IV elements, a compound semiconductor from Group III-V elements, and a compound semiconductor from Group II-VI elements.

5. The nano-scale electrical sensor of claim 1, wherein the substrate has a (110) semiconductor layer with a crystal structure selected from a diamond crystal structure and a zinc-blende crystal structure.

6. The nano-scale electrical sensor of claim 1, wherein the substrate is a silicon-on-insulator (SOI) wafer, the silicon layer having the [110] crystal direction.

7. The nano-scale electrical sensor of claim 1, wherein the substrate is a gallium arsenide-on-insulator wafer, the gallium arsenide layer having the [110] crystal direction.

8. The nano-scale electrical sensor of claim 1, wherein the nanowire sensing element has a meandered pattern along a length of the nanowire sensing element that increases a surface area of the nanowire sensing element, the meandered pattern comprising a plurality of meander sections, the vertical sidewalls of the nanowire sensing element in a meander section comprising (111) vertical planes of both a first set of (111) vertical lattice planes and a second set of (111) vertical lattice planes to maintain the atomical smoothness of the vertical sidewalls for sensing, the first set and the second set being angularly spaced to intersect at angles that facilitate defining the meandered pattern.

9. A nano-scale electrical sensor comprising:
a substrate having a [110] direction;
a nanowire sensing element having vertical sidewalls that are (111) vertical lattice planes of the substrate, wherein the substrate and the nanowire sensing element comprise a semiconductor material; and
an electrical contact at opposite ends of the nanowire sensing element, the electrical contacts facilitating one or both of conductivity and resistivity measurements of the nanowire sensing element,
wherein the (111) vertical sidewalls are atomically smooth to facilitate sensing, the atomical smoothness being relative to a dry chemical-etched surface.

10. The nano-scale electrical sensor of claim 9, wherein the nanowire sensing element has a meandered pattern along a length of the nanowire sensing element, the meandered pattern comprising a plurality of meander sections of the nanowire sensing element, wherein the (111) vertical sidewalls of the nanowire sensing element in a meander section comprise intersecting (111) vertical lattice planes of the substrate that facilitate defining the meandered pattern.

11. A nano-scale device comprising:
a substrate having a [110] direction;
a nanowire having vertical sidewalls that are (111) vertical lattice planes of the substrate, wherein the substrate and the nanowire comprise a semiconductor material;
an electrical contact to the nanowire; and
a nano-pn junction vertically stacked on the nanowire, wherein the nano-pn junction is between the electrical contact and the nanowire.

12. A nano-scale device comprising:

a substrate having a [110] direction;

a nanowire having vertical sidewalls that are (111) vertical lattice planes of the substrate, wherein the substrate and the nanowire comprise a semiconductor material; and an electrical contact to the nanowire, wherein the nanowire comprises:

a first nano-electrode having parallel (111) vertical lattice planes as the vertical sidewalls; and a nano-pn junction vertically stacked on the first nano-electrode, such that the nano-pn junction shares the parallel vertical sidewalls of the first nano-electrode, the nano-pn junction having a (110) planar end, and wherein the electrical contact comprises a second nano-electrode deposited on the (110) planar end of the nano-pn junction, the nano-scale device being a nano-pn diode.

13. The nano-scale device of claim 12, wherein the nanowire is repeated on the substrate as separate first nano-electrodes in parallel columns, the nano-pn junction being repeated on the first nano-electrodes of each column to form an array of separate nano-pn junctions, and wherein the second nano-electrode is repeated in parallel rows that separately bridge across the parallel columns to contact the nano-pn junctions in the array, such that the nano-pn diode is a diode array.

14. The nano-scale device of claim 12, further comprising a switching material between the (110) planar end of the pn-junction and the second nano-electrode.

* * * * *